(12) United States Patent
Montierth et al.

(10) Patent No.: US 11,087,824 B2
(45) Date of Patent: Aug. 10, 2021

(54) COLUMN SELECT SWIZZLE

(71) Applicant: Micron Technology, Inc., Boise, ID (US)

(72) Inventors: Dennis G. Montierth, Meridian, ID (US); Boon Hor Lam, Boise, ID (US); C Omar Benitez, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/740,040

(22) Filed: Jan. 10, 2020

(65) Prior Publication Data

US 2021/0217460 A1 Jul. 15, 2021

(51) Int. Cl.
*G11C 11/408* (2006.01)
*G11C 11/4094* (2006.01)

(52) U.S. Cl.
CPC ...... *G11C 11/4085* (2013.01); *G11C 11/4087* (2013.01); *G11C 11/4094* (2013.01)

(58) Field of Classification Search
CPC ............ G11C 11/4085; G11C 11/4087; G11C 11/4094
See application file for complete search history.

(56) References Cited

U.S. PATENT DOCUMENTS

| 7,196,943 | B2 * | 3/2007 | Mirichigni | G11C 16/24 365/185.18 |
| 7,535,761 | B2 * | 5/2009 | Park | G11C 16/3418 365/185.11 |
| 8,659,950 | B1 * | 2/2014 | Yano | G11C 16/26 365/185.21 |
| 2019/0180812 | A1 * | 6/2019 | Sung | G11C 11/4099 |

* cited by examiner

*Primary Examiner* — Tri M Hoang
(74) *Attorney, Agent, or Firm* — Perkins Coie LLP

(57) ABSTRACT

A memory device includes a memory array having a plurality of memory cells and a column decoder circuit that is configured to provide at least one column select signal for selecting corresponding bit-lines for memory operations on the plurality of memory cells. The memory device also includes a column select section that is configured to route the at least one column select signal such that non-adjacent bit-lines are exclusively selected during a same column select access memory operation.

16 Claims, 5 Drawing Sheets

COLUMN SELECT SWIZZLE

TECHNICAL FIELD

The present disclosure generally relates and apparatus and method for performing a column select ("CS") in a memory array, and more particularly, performing column select operations in which non-adjacent bit-lines are exclusively selected for memory operations.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), static RAM (SRAM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

Memory cell defectivity due to, for example, cell-to-cell shorts is starting to become a limiter in process capability and has always been a concern when trying to hit low defects per million (DPM) quality metrics. Memory devices can include ECC error checking algorithms for detecting and/or, in some cases, correcting bit errors in memory cells due to, for example, cell-to-cell shorts. Typically, 1-bit cell-to-cell shorts that span across word lines can be corrected. However, cell-to-cell shorts that occur on the same word line can be an issue as the ECC error correction algorithms may not be able to fix these types of memory defects.

DETAILED DESCRIPTION

Embodiments of the present technology are directed to memory devices, systems including memory devices, and methods of performing column select. In one embodiment, a memory device includes a memory array having a plurality of memory cells and a column decoder circuit that is configured to provide at least one column select signal for selecting corresponding bit-lines for memory operations on the plurality of memory cells. The memory device also includes a column select section that is configured to route the at least one column select signal such that non-adjacent bit-lines are exclusively selected during a same column select access memory operation.

Figure 1:
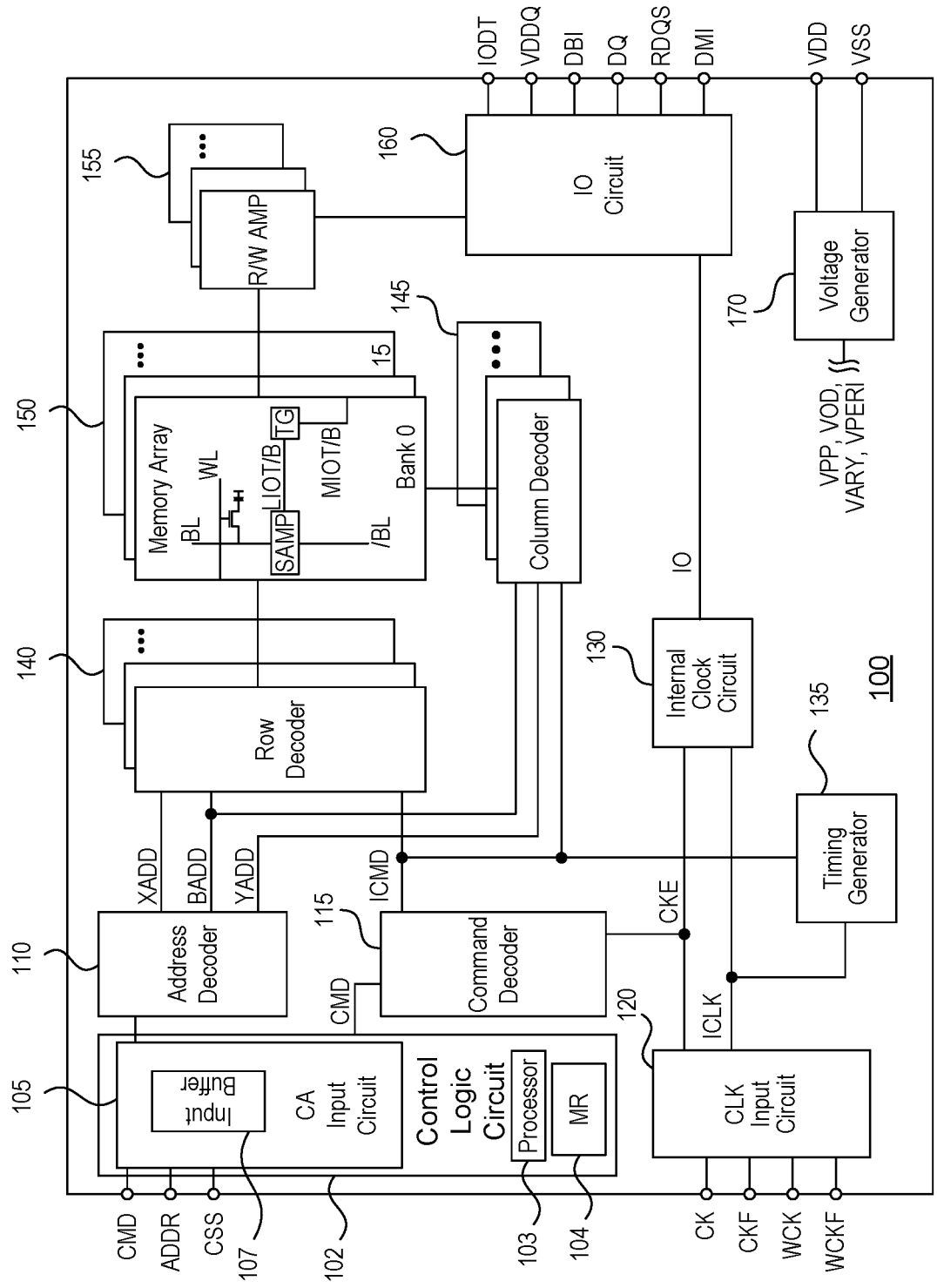
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command/address terminals to receive CMD and ADDR signals. The memory device may further include a chip select terminal to receive a chip select signal CSS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and input-output on-die terminal(s) IO-ODT.

The address signals ADDR can be transmitted from, for example, an external controller. The address signals ADDR supplied to the ADDR terminals can be transferred, via a command/address (CA) input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145. As seen in FIG. 1, in some embodiments, the CA input circuit 105 can be part of control logic circuit 102. Control logic circuit 102 can include processor 103 that can perform the all or part of the processing steps of memory module 100. The control logic circuit 102 can also include the mode register 104 that can store the settings used to configure various circuits in the memory module 100.

The command signals CMD can also be transmitted from, for example, an external controller. The CMD signals can represent various memory commands from the memory controller (e.g., including access commands, which can include read commands and write commands). The CSS signal can be used to select the memory device 100 to respond to commands and addresses provided to the command/address terminals. The CMD, ADDR, and the CSS signals can be transmitted from, for example, an external controller. When an active CSS signal is provided to the memory device 100, the commands and addresses in the signals can be decoded and memory operations can be performed. The CMD signals may be provided to a command decoder 115 via the CA input circuit 105. The command decoder 115 may include circuits to decode the CMD signals to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information that can be programmed in the memory device 100, for example, in a mode register 104. The read latency information can be defined in terms of clock cycles of the CK clock signal. For example, the read latency information can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency information. The write latency information can be programmed in the memory device 100, for example, in the mode register 104. The write latency information can be defined in terms of clock cycles of the CK clock signal. For example, the write latency information can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The input-output on-die termination terminal(s) may be supplied with an IODT signal. The IODT signals can be supplied to the input/output circuit 160 to instruct the memory device 100 to enter an I/O on-die termination mode (e.g., to provide one of a predetermined number of impedance levels at one or more of the other input-output terminals of the memory device 100).

Figure 2:
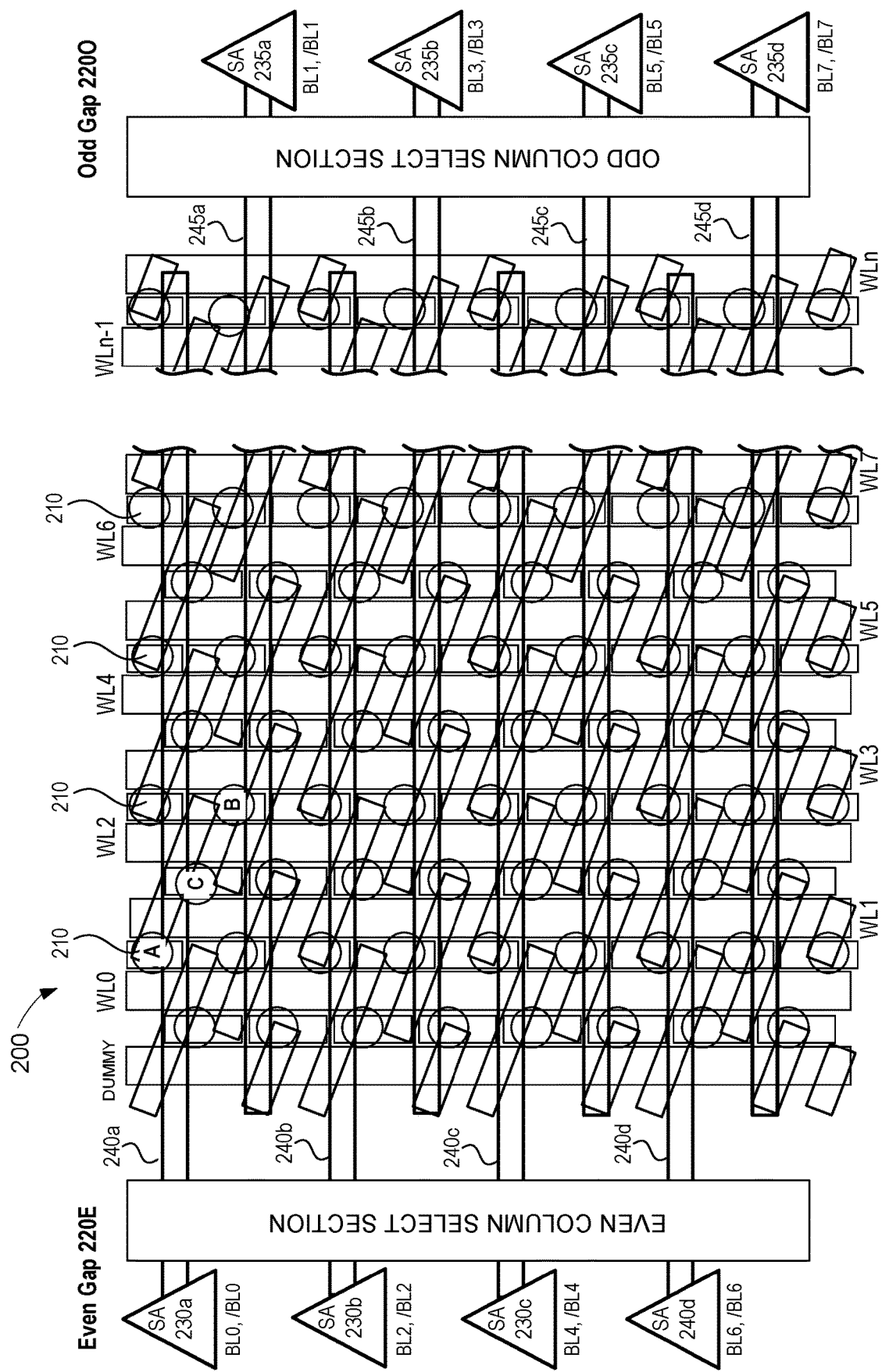
FIG. 2 is a simplified block diagram schematically illustrating a portion of a memory array that can be used in the embodiment of FIG. 1.

A simplified block diagram of a layout of a portion of a memory array 150 is illustrated in FIG. 2. FIG. 2 illustrates a memory sub-array 200 of the memory array 150. In some embodiments, the memory array 150 can include a plurality of memory sub-arrays 200. The memory sub-array 200 includes a grid of memory cells 210 (for clarity the reference numeral 210 points to the charge storage element of the memory cell in FIG. 2). Each memory cell 210 can be accessed based on a row signal from row decoder 140 that sequentially selects one of the word lines WL0-WLn and a column select signal ("CS signal") from column decoder 145 that selects one or more columns or bit-lines. For example, each memory sub-array 200 can include eight bit-lines. The bit-lines can be arranged into groups based on the configuration of the memory sub-array 200. For example, the bit-lines can be arranged into two groups of bit-lines such as, for example, bit-lines 240 and bit-lines 245. As seen in FIG. 2, the bit-lines 240 (also referred to herein as even bit-lines) and the bit-lines 245 (also referred to herein as odd bit-lines) are arranged in an alternating column format (e.g., an even/odd format in which the bit-lines are arranged in the order: 240*a*, 245*a*, 240*b*, 245*b*, 240*c*, 245*c*, 240*d*, 245*d*). The layout of the memory sub-array 200 can include gap sections 220E and 220O, and the sense amplifiers SA for reading the memory cells 210 and other associated circuits (not shown) can be disposed in the gap sections 220E and 220O. For example, as seen in FIG. 2, the even gap 220E includes one or more sense amplifiers 230 that connect to the memory cells 210 via even bit-lines 240 and the odd gap 220O includes one or more sense amplifiers 235 that connect to the memory cells 210 associated with the odd bit-lines 245. Depending on the configuration of the memory sub-array 200, each sense amplifier 230, 235 receives two lines with one line corresponding to the BL # signal and the other line corresponding to the /BL # signal. As used herein, the "/" designates a complementary signal, and # is an integer number. In addition, for clarity, when discussing the embodiments discussed herein, "bit-line" refers to both the BL line and the /BL line. However, those skilled in the art understand that, depending on the configuration of the memory array and/or the sense amplifiers, bit-line can refer to just the BL signal line or the /BL signal line. The gap sections 220E and 220O can include one or more column select sections (e.g., even and odd column select sections) that are configured to route the column select signals, as discussed below.

In related art systems, a CS signal selects multiple bit-lines (e.g., eight bit-lines or more) that are disposed adjacent to each other. For example, as discussed above, the even bit-lines 240*a-d* and the odd bit-lines 245*a-d* are disposed adjacent to each other in an alternative column format in the memory sub-array 200. In a related art system, the even and odd bit-lines are selected simultaneously based on the CS signal. That is, the CS signal simultaneously selects even bit-lines 240*a-d* corresponding to signal pairs BL0-/BL0, BL2-/BL2, BL4-/BL4, and BL6-/BL6, respectively, and odd bit-lines 245*a-d* corresponding to signal pairs BL1-/BL1, BL3-/BL3, BL5-/BL5, and BL7-/BL7. When a row signal selects a word line such as, for example, one of the word lines WL0-WLn, the bit-data stored by the memory cells 210 corresponding to the selected word line is simultaneously read by the corresponding sense amplifiers (e.g., SA 230a-d for even columns and SA 235a-d for odd columns). However, read errors can occur when the stored bit-data gets corrupted due to defects in the memory cell such as, for example, cell-to-cell shorts. In some cases, such as, for example, cell-to-cell defects that span word lines, the read errors may be correctable using error correction code (ECC) algorithms. For example, with reference to FIG. 2, if memory cell A is shorted to memory cell B, a bit-data error due to the short can occur when WL1 is activated and cell A is read on bit-line 240a, and a bit error can occur when WL2 is activated and cell B is read on bit-line 240a. However, these single bit errors can be correctable using ECC algorithms because they occur on different word line reads and do not show up on the same ECC prefetch.

In contrast, when a cell-to-cell defect affects the same word line, ECC algorithms may not be able to correct for the read errors. Cell-to-cell defects on the same word line typically occur between adjacent bit-lines, which include an odd bit-line and an even bit-line. For example, if a cell-to-cell short occurs between memory cell B and memory cell C, only WL2 is affected. When WL2 is selected, two potential bit errors could occur on the same ECC prefetch. For example, a bit error could occur on even bit-line 240a (due to defect in cell B) and another bit error could occur on odd bit-line 245a (due to defect in cell C). In such cases, the two potential bit errors on the same word line (same ECC prefetch) may not be correctable using ECC algorithms.

In exemplary embodiments of the present technology, one or more column select sections (e.g., see boxes in FIG. 2) can be configured to route the CS signals such that non-adjacent bit-lines are exclusively selected during a same CS access memory operation (e.g., read, write, prefetch, and/or some other memory operation). That is, at least one column select section can be configured such that adjacent bit-lines are not selected for memory operations at the same time. In some embodiments, the column select sections can be disposed in the gap section 220E and/or the gap section 220O and/or some other gap section in memory array 150. In some embodiments, the column select section is configured to redirect the CS signals such that non-adjacent bit-lines are exclusively selected (that is, adjacent bit lines are not selected) during a same CS access operation. In some embodiments, the configuration of one or more column select lines carrying the respective CS signals in the even gap 220E and/or the odd gap 220O can include swizzle metal layers (also referred to herein as swizzle layers) to redirect one or more of the CS signals to prevent bit-lines that are disposed adjacent to each other (e.g., an even bit-line adjacent an odd bit-line) from being selected at the same time. By insuring that these adjacent even/odd bit-lines are not selected simultaneously, any potential cell-to-cell defects will only affect a single data bit (e.g., either the data bit on the odd bit-line or the data bit on the even bit-line) during a single CS access operation. Because only a single data bit is affected, the ECC algorithms should correct for any single-bit errors occurring during the ECC prefetch. ECC algorithms are known in the art and thus will not be further discussed.

Figure 3A:
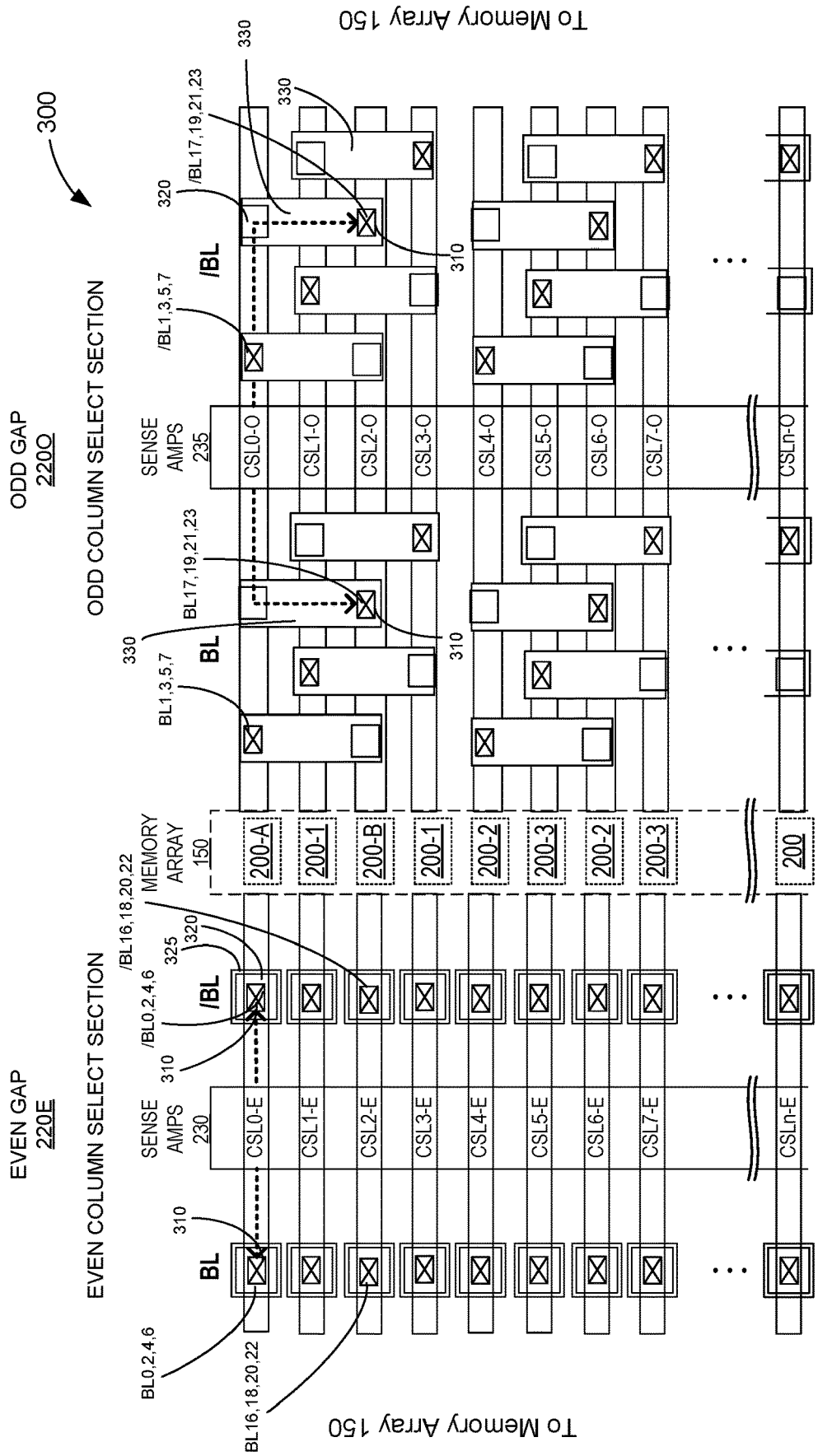
FIG. 3A is a simplified block diagram of an embodiment of asymmetrical column select sections having a swizzle configuration in accordance with an embodiment of the present technology.

FIG. 3A illustrates a simplified block diagram of the column select sections in the even and odd gaps 220E, 220O adjacent the memory array 150. The memory array 150 includes a plurality of memory-subarrays 200. As discussed above, each memory sub-array 200 can have even and odd bit-lines arranged in an alternating column format. The even and odd column select sections can include one or more column select lines (CSLs) that are each connected to one or more bit-lines. For example, CSL0-E to CSLn-E can be connected to corresponding even bit-lines 240 of the memory array 150 and CSL0-O to CSLn-O can be connected to corresponding odd bit-lines 245 of the memory array 150. The connection of the CSLs to the corresponding bit-lines in the memory sub-arrays 200 is discussed in more detail below. In some embodiments, CSLs can be, for example, metal layers and can be configured to receive respective CS signals from the column decoder 145. In some embodiments, the corresponding CSLs can receive the same CS signal. For example, CSL0-E and CSL0-O can receive the same CS signal. However, in exemplary embodiments of the present invention, although corresponding CSLs can receive the same column select signal, the CS signal can be routed to different memory sub-arrays 200 so that adjacent bit-lines are not selected.

FIG. 3A illustrates an embodiment of the present technology in which the odd column select section and the even column select section route corresponding CS signals to different memory sub-arrays 200. As seen in FIG. 3A, each even CSL can be connected to four even bit-lines 240 of a memory sub-array 200 (see FIG. 2). For example, CSL0-E can be connected to bit-lines (BL, /BL) 0, 2, 4, 6; CSL1-E can be connected to bit-lines (BL, /BL) 8, 10, 12, 14, CSL2-E can be connected to bit-lines (BL, /BL) 16, 18, 20, 22, and so on (for clarity, only selected elements are labeled in FIG. 3A). As seen in FIG. 3A, the connections to the respective bit-lines is represented by bit-line connector 310. For the even column select section, a metal layer 320 is disposed between the bit-line connector 310 and a CSL connection layer 325. The CSL connection layer 325 connects the respective CSL to the metal layer 320 and thus a connection path is provided for the respective CS signals to the corresponding bit-lines. For example, a CS signal on CSL0-E is transmitted to bit-lines (BL, /BL) 0, 2, 4, 6 of memory sub-array 200-A via CSL connection layer 325, metal layer 320, and bit-line connector 310. Of course, some or all of these connectors/layers can be integrated into a single connector/layer.

To ensure adjacent bit-lines are not selected by a CS signal, in some embodiments, as seen in FIG. 3A, swizzle metal layers can be used to route the respective CS signals to different memory sub-arrays 200 than those of the even column select signal. For example, in the example above, the CS signal on CSL0-E is routed to the even bit-lines memory sub-array 200-A. Rather than routing the CS signal to the odd bit-lines in memory array 200-A, however, the corresponding CS signal on CSL0-O can be routed by a swizzle layer 330 to the odd bit-lines (BL, /BL) 17, 19, 21, 23 of memory sub-array 200-B (or another memory array 200). Similar to the CSL connection layer 325, the swizzle layer 330 is connected to the CSL by metal layer 320 and connected to the corresponding bit-lines by a bit-line connector 310. Thus, as shown by the dotted lines in FIG. 3A, the CS signal received by CSL0-E and CSL0-O is respectively routed to the even bit-lines (BL, /BL) 0, 2, 4, 6 on memory sub-array 200-A and to the odd bit-lines (BL, /BL) 17, 19, 21, 23 on memory sub-array 200-B via swizzle layers 330. Similarly, a CS signal on CSL2-E and CSL2-O are respectively routed to the even bit-lines (BL, /BL) 16, 18, 20, 22 on memory sub-array 200-B and to the odd bit-lines (BL, /BL) 1, 3, 5, 7 on memory sub-array 200-A. The other memory sub-arrays 200 can be similarly paired. For example, as seen in FIG. 3A, memory sub-arrays 200-1 corresponding to CSL1-E/O and CSL3-E/O can be paired, memory sub-arrays 200-2 corresponding to CSL4-E/O and CSL6-E/O can be paired, memory sub-arrays 200-3 corresponding to CSL5-E/O and CSL7-E/O can be paired, and so on. Because the CS signal routing for the other pairs of memory sub-arrays 200 is similar to that given above with respect to memory sub-arrays 200-A and B, for brevity, a detailed description is omitted. Of course, other pairings and/or other combinations of memory sub-arrays 200 can be used so long as adjacent bit-lines are not selected by during a same column select access memory operation.

In the above embodiments, four bit-lines are disposed between each selected bit-line of memory sub-array 200-A and each selected bit-line of memory sub-array 200-B because another memory sub-array 200 is disposed between the memory sub-array 200-A and 200-B. However, more there can be more than four bit-lines (e.g., by pairing up with a memory sub-array 200 that is more than two memory sub-arrays away). In some embodiments, the pairing can be between adjacent memory sub-arrays, but some issues of same row cell-to-cell defects can remain if four or more bit-lines are not disposed between the selected bit-lines.

In the embodiment of FIG. 3A, the odd column select section disposed in, for example, the odd gap 220O, includes the swizzle metal layers 330 while the even column select section disposed in the even gap 220E does not include a swizzle metal layer. Of course, in some embodiments, the even column select section can include swizzle metal layers while the odd column select section does not include a swizzle metal layer.

Figure 3B:
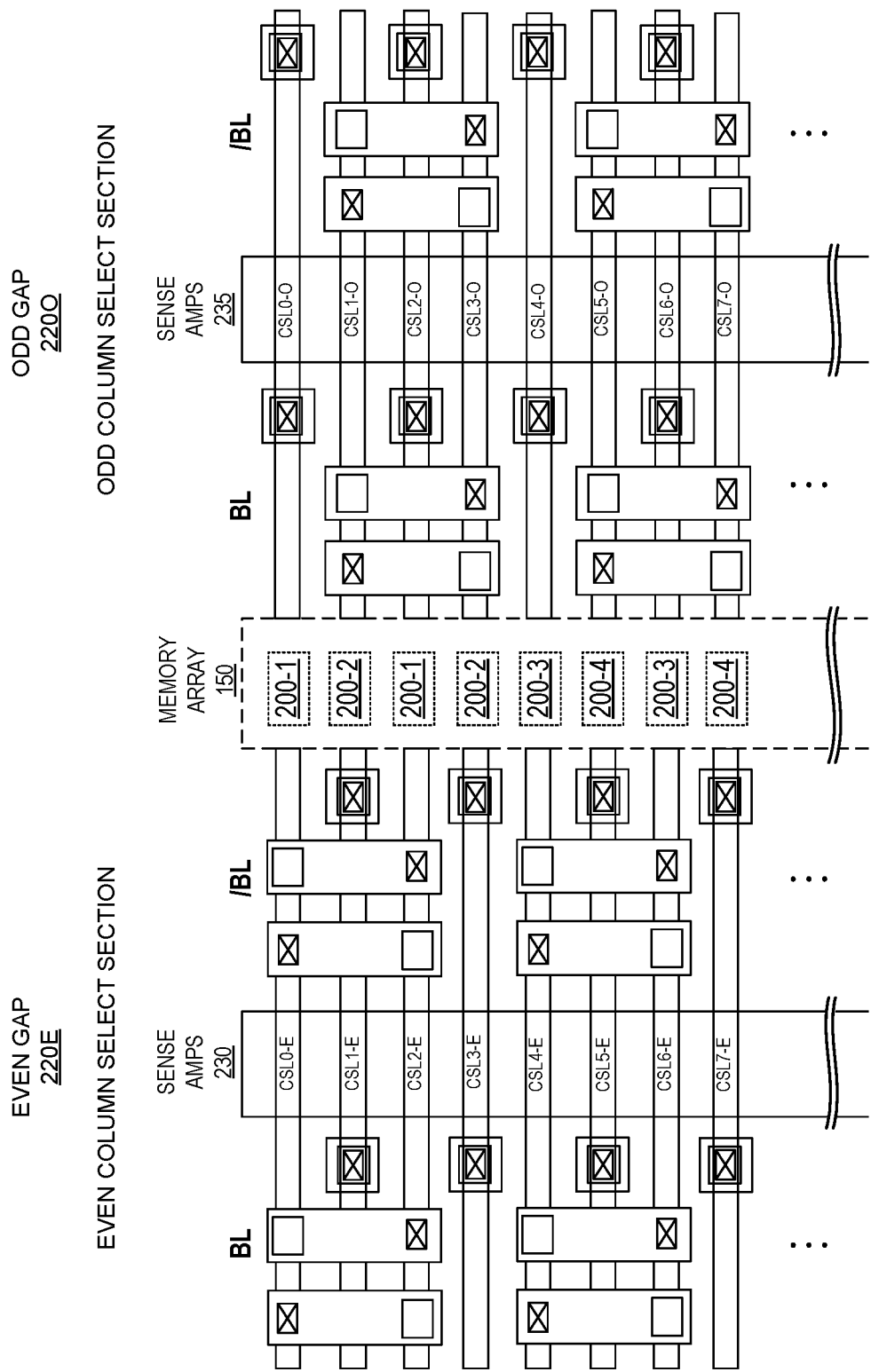
FIG. 3B is a simplified schematic of another embodiment of symmetric column select sections having a swizzle configuration in accordance with an embodiment of the present technology.

FIG. 3B illustrates another embodiment consistent with the present technology. Similar to the embodiments discussed above, in the embodiment of FIG. 3B, the memory sub-arrays 200 are paired (e.g., memory sub-array pairs 200-1, 200-2, 200-3, and 200-4), and the paired memory sub-arrays 200 are configured such that a CS signal is routed to the even bit-lines of one memory sub-array pair and routed to the odd bit-lines of the other memory sub-array pair. Those skilled in the art will understand that the routing of the CS signal to the respective even and odd bit-lines is similar to that discussed above and thus, for brevity, will not be discussed further. Of course, similar to the embodiment of FIG. 3A, other memory sub-array pairings and/or other combinations of memory sub-arrays 200 can be used so long as adjacent bit-lines are not selected by during a same column select access memory operation.

In the embodiment of FIG. 3A, the column select sections are asymmetrical in that the swizzle metal layers are only disposed in the odd column select section. In the embodiment of FIG. 3B, the configuration of the column select sections is symmetrical in that the swizzle metal layers are disposed in both the even and odd column select sections. As seen in FIG. 3B, half of the memory sub-array pairings are configured such that the CS signal is routed to the odd bit-lines via swizzle metal layers. For example, in memory sub-array pairs 200-2 and 200-4 the respective CS signals to the odd bit-lines are routed through swizzle layers (odd bit-line swizzle pairs). In contrast, for memory sub-array pairs 200-1 and 200-3, the respective CS signals to the even bit-lines are routed through swizzle layers (even bit-line swizzle pairs). In the embodiment of FIG. 3B, the odd bit-line swizzle pairs and the even bit-line swizzle pairs are arranged in an alternating format. However, any configuration of odd bit-line swizzle pairs and even bit-line swizzle pairs can be used.

Figure 4:
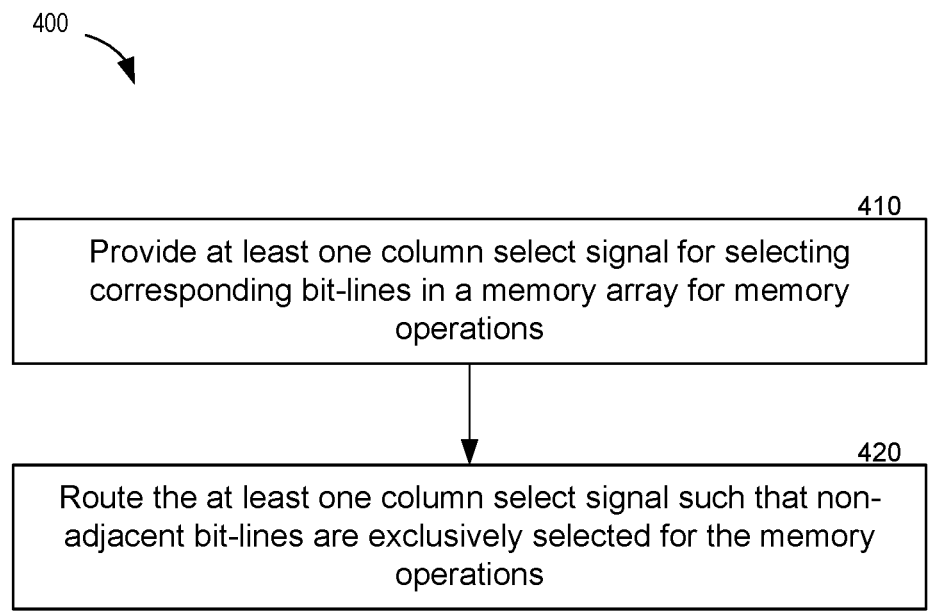
FIG. 4 is a flow chart illustrating a method of performing a column select in accordance with an embodiment of the present technology.

FIG. 4 is a flow diagram illustrating example method 400 for performing a column select operation in a memory array. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the processor 103 and/or another processor or controller. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 410, the processing device (e.g., controller 103 and/or another processor or controller) provides at least one column select signal for selecting corresponding bit-lines in a memory array for memory operations. For example, as discussed above, the column decoder 145 can provide one or more CS signals, which can be received by one or more column select lines (e.g., CSL #-E/O) in the memory array 150.

At block 420, the processing device (e.g., controller 103 and/or another processor or controller) routes the at least one column select signal such that non-adjacent bit-lines are exclusively selected for the memory operations. For example, as discussed above, a CS signal can be routed the even bit-lines 240 in a memory sub-array 200-A, and the CS signal can be routed to the odd bit-lines 245 in a different memory sub-array 200-B (or vice-versa).

Although in the foregoing example embodiments, memory modules and devices have been illustrated and described with respect to DRAM devices, embodiments of the present technology may have application to other memory technologies, including SRAM, SDRAM, NAND and/or NOR flash, phase change memory (PCM), magnetic RAM (MRAM), ferroelectric RAM (FeRAM), etc.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
   a memory array having a plurality of memory cells;
   a column decoder circuit configured to provide at least one column select signal for selecting corresponding bit-lines for memory operations on the plurality of memory cells; and
   a column select section configured to route the at least one column select signal such that non-adjacent bit-lines are exclusively selected during a same column select access memory operation,
   wherein the memory array is segmented into a plurality of memory sub-arrays, each memory sub-array having first bit-lines and second bit-lines that are disposed in the memory sub-array in an alternating column format,
   wherein the plurality of memory sub-arrays includes at least one first memory sub-array and at least one second memory sub-array,
   wherein the column select section is configured such that the at least one column select signal is routed to the first bit-lines of the at least one first memory sub-array and to the second bit-lines of the at least one second memory sub-array,
      wherein the column select section includes at least one swizzle layer and at least one column select line, the at least one column select line configured to receive the at least one column select signal, and
      wherein the at least one swizzle layer is disposed so as to connect the at least one column select line to the second bit-lines of the at least one second memory sub-array, and the at least one swizzle layer is configured to route the at least one column select signal to the second bit-lines of the at least one second memory sub-array.

2. The apparatus of claim 1, wherein at least four bit-lines are disposed between each selected bit-line of the at least one first memory sub-array and each selected bit-line of the at least one second memory sub-array.

3. The apparatus of claim 1, wherein the column select section further includes at least one second column select line that is configured to receive the at least one column select signal and configured to route the at least one column select signal to the first bit-lines of the at least one first memory sub-array.

4. The apparatus of claim 1, wherein the at least one swizzle layer is disposed in at least one gap portion of the memory array.

5. The apparatus of claim 1, wherein the plurality of memory sub-arrays further includes at least one third memory sub-array and at least one fourth memory sub-array,
   wherein the column select section includes at least one second swizzle layer and at least one second column select line, the at least one second column select line configured to receive at least one second column select signal, and
   wherein the at least one second swizzle layer is disposed so as to connect the at least one second column select line to the first bit-lines of the at least one third memory sub-array, and the at least one second swizzle layer is configured to route the at least one second column select signal to the first bit-lines of the at least one third memory sub-array.

6. The apparatus of claim 5, wherein the column select section further includes at least one third column select line that is configured to receive the at least one second column select signal and configured to route the at least one second column select signal to the second bit-lines of the at least one fourth memory sub-array.

7. The apparatus of claim 5, wherein the first and second swizzle layers are disposed in at least one gap portion of the memory array.

8. The apparatus of claim 1, wherein the memory operations include at least one of read operations, write operations, or ECC prefetch operations.

9. A method, comprising:
   providing at least one column select signal for selecting corresponding bit-lines in a memory array for memory operations;
   routing the at least one column select signal such that non-adjacent bit-lines are exclusively selected for the memory operations;
   segmenting the memory array into a plurality of memory sub-arrays, the plurality of memory sub-arrays including at least one first memory sub-array and at least one second memory sub-array;
   disposing first bit-lines and second bit-lines in an alternating column format in each memory sub-array;
   routing at least one column select signal to the first bit-lines in the at least one first memory sub-array;
   routing the at least one column select signal to the second bit-lines in the at least one second memory sub-array;
   disposing at least one swizzle layer and at least one column select line in the memory array such that the at least one swizzle layer connects the at least one column select line to the second bit-lines of the at least one second memory sub-array, the at least one column select line configured to receive the at least one column select signal; and routing the at least one column select signal to the second bit-lines of the at least one second memory sub-array via the at least one swizzle layer.

10. The method of claim 9, further comprising disposing at least four bit-lines between each selected bit-line of the at least one first memory sub-array and each selected bit-line in the at least one second memory sub-array.

11. The method of claim 9, further comprising:
receiving the at least one column select signal via at least one second column select line; and
routing the at least one column select signal to the first bit-lines of the at least one first memory sub-array via the at least one second column select line.

12. The method of claim 9, wherein the at least one swizzle layer is disposed in at least one gap portion of the memory array.

13. The method of claim 9, wherein the plurality of memory sub-arrays further includes at least one third memory sub-array and at least one fourth memory sub-array, the method further comprising:
disposing at least one second swizzle layer in the memory array such that the at least one second swizzle layer connects at least one second column select line to the first bit-lines of the at least one third memory sub-array;
receiving at least one second column select signal via the at least one second column select line; and
routing the at least one second column select signal to the first bit-lines of the at least one third memory sub-array via the at least one second swizzle layer.

14. The method of claim 13, further comprising:
receiving the at least one second column select signal via at least one third column select line; and
routing the at least one second column select signal to the second bit-lines of the at least one fourth memory sub-array via the at least one third column select line.

15. The method of claim 13, wherein the at least one first swizzle layer and the at least one second swizzle layer are disposed in at least one gap portion of the memory array.

16. The method of claim 9, wherein the memory operations include at least one of read operations, write operations, or ECC prefetch operations.

* * * * *